United States Patent

Kobashi et al.

Patent Number: 5,373,172
Date of Patent: Dec. 13, 1994

[54] SEMICONDUCTING DIAMOND LIGHT-EMITTING ELEMENT

[75] Inventors: Koji Kobashi, Nishinomiya, Japan; Koichi Miyata, Raleigh, N.C.; Kazuo Kumagai, Kobe, Japan; Shigeaki Miyauchi, Kobe, Japan; Yuichi Matsui, Kobe, Japan

[73] Assignee: Kabushiki Kaisha Kobe Seiko Sho, Kobe, Japan

[21] Appl. No.: 544

[22] Filed: Jan. 4, 1993

Related U.S. Application Data

[63] Continuation of Ser. No. 645,257, Jan. 24, 1991, abandoned.

Foreign Application Priority Data

Jan. 26, 1990 [JP] Japan .................. 2-17591

[51] Int. Cl.$^5$ .............. H01L 29/161; H01L 33/00; H01L 29/205; H01L 23/48
[52] U.S. Cl. ......................... 257/77; 257/76; 257/79; 257/414; 257/431; 257/448; 257/453; 257/754
[58] Field of Search .............. 357/17, 16, 56, 61, 357/65, 68, 15; 257/414, 431, 432, 433, 448, 453, 754, 79, 76, 77

References Cited

U.S. PATENT DOCUMENTS 5,006,914 4/1991 Beetz, Jr. ................... 357/56
5,057,881 10/1991 Lobentanzer et al. .......... 257/712

FOREIGN PATENT DOCUMENTS 57-24913 8/1983 Japan ..................... 357/17

*Primary Examiner*—Andrew J. James
*Assistant Examiner*—Carl Whitehead, Jr.
*Attorney, Agent, or Firm*—Oblon, Spivak, McClelland, Maier & Neustadt

[57] ABSTRACT

A semiconducting diamond electroluminescence element comprises an electrically conductive substrate, a semiconducting diamond layer formed on the substrate, an insulating diamond layer formed on the semiconducting diamond layer, a front electrode formed on the insulating diamond layer, and a back electrode formed on the conductive substrate in ohmic contact with the same. The color of light to be emitted by the semiconducting diamond electroluminescence element can readily be determined by changing the impurity content in the semiconducting diamond layer. The luminescence intensity of the semiconducting diamond electroluminescence element can readily be changed by changing the voltage applied across the front and back electrodes without entailing dielectric breakdown.

6 Claims, 4 Drawing Sheets

F I G. 1
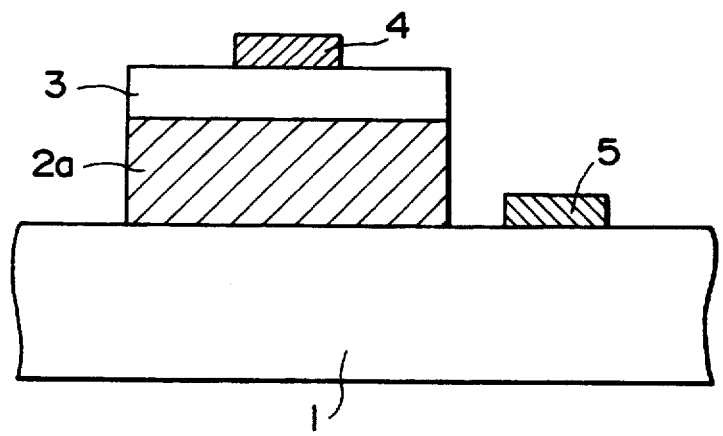
F I G. 2
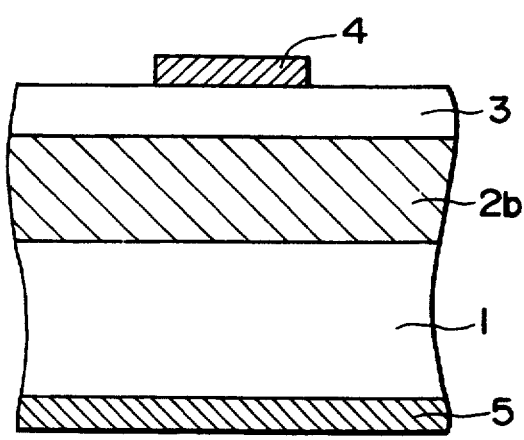

SEMICONDUCTING DIAMOND LIGHT-EMITTING ELEMENT

This application is a continuation of application Ser. No. 07/645,257, filed on Jan. 24, 1991, now abandoned.

BACKGROUND OF THE INVENTION

1. Field of the Invention

The present invention relates to a light-emitting element of a novel structure employing semiconducting diamond films. It is capable of emitting a short wavelength light, such as bluish light.

2. Description of the Prior Art

Diamond has a wide band gap of 5.5 eV and is expected to be used for solid-state devices for emitting light in a short-wavelength region. P-type semiconducting diamond films doped with boron (B) can be produced by vapor-phase synthesis. Research and development activities have been conducted to develop semiconducting diamond electroluminescence (EL) devices, capable of emitting a short wavelength light, employing the p-type semiconducting diamond films.

Such a semiconducting diamond EL element having a structure as shown in FIG. 5 is proposed in Japan Applied Physics Society 1989 Spring Meeting Abstract, Vol. 2, P. 481. Referring to FIG. 5, the semiconducting diamond EL element comprises a single crystal diamond substrate 51, a p-type semiconducting diamond layer 52 formed over the surface of the diamond substrate 51 by vapor-phase synthesis and doped with B, a Schottky electrode 53 formed of tungsten (W) in Schottky contact with the p-type semiconducting diamond layer 52, and an ohmic electrode 54 formed of titanium (Ti) in ohmic contact with the p-type semiconducting diamond layer 52.

Shown in FIG. 6 is the energy band diagram for the semiconducting diamond EL element of FIG. 5 when a voltage V is applied across the Schottky electrode 53 (positive) and the ohmic electrode 54 (negative). In FIG. 6, indicated at $E_F$ is the Fermi level, indicate at $E_C$ is the energy at the lower end of the conduction band of the p-type semiconducting diamond layer 52, and indicate at $E_V$ is the energy at the upper end of the valence band of the p-type semiconducting diamond layer 52. In FIG. 6, holes are represented by open circles, and electrons are represented by solid circles. Holes can move by a quantum effect from the Schottky electrode 53 to the p-type semiconducting diamond layer 52, and then recombine with electrons at the defect levels to emit a bluish light.

Since this EL element uses a rectifying Schottky contact on the p-type semiconducting diamond layer, the Schottky characteristic is sensitively dependent on both the boron doping concentration and the surface condition of the p-type semiconducting diamond layer. Therefore, it is difficult to form the Schottky electrode with a predetermined Schottky characteristic. Furthermore, since the wavelength of the light is greatly dependent on the doping concentration in the p-type semiconducting diamond layer, which is a light emitting layer, it is difficult to change the degree of doping without changing the predetermined Schottky characteristic, and hence it is also difficult to determine the color of light to be emitted. Finally, since the reverse bias voltage applied to the EL element should be limited in a narrow voltage range slightly below the breakdown voltage, it is difficult to control the voltage to vary the EL intensity.

SUMMARY OF THE INVENTION

It is an object of the present invention to provide a semiconducting diamond electroluminescence (EL) element capable of solving the problems in the conventional semiconducting diamond EL element.

In one aspect of the present invention, a semiconducting diamond EL element comprises an electrically conductive substrate, a semiconducting diamond layer formed on the substrate, an insulating diamond layer formed on the semiconducting diamond layer, a front electrode formed on the insulating diamond layer, and a back ohmic electrode formed on the backside of the substrate.

Since the semiconducting diamond EL element in accordance with the present invention has the insulating diamond layer sandwiched between the front electrode and the p- or n-type semiconducting diamond layer, the semiconducting diamond layer can be doped with an impurity in a desired impurity content without being restricted by the characteristics of the contact between the metal electrode and the semiconducting diamond layer, so that the color of light to be emitted by the semiconducting diamond EL element can be readily determined only by doping concentration independent of the contact characteristics. Since the voltage may be applied across the semiconducting diamond layer in forward biasing, the EL intensity can be arbitrarily adjusted by changing the forward bias voltage without causing dielectric breakdown.

BRIEF DESCRIPTION OF THE DRAWINGS

The above and other objects, features and advantages of the present invention will become more apparent from the following description taken in connection with the accompanying drawings, in which:

FIG. 1 is a sectional view of a semiconducting diamond EL element in a first embodiment according to the present invention;

FIG. 2 is a sectional view of a semiconductor diamond luminous element in a second embodiment according to the present invention;

DESCRIPTION OF THE PREFERRED EMBODIMENTS

Prior to the description of the preferred embodiments of the present invention, the light emitting mechanism of a semiconducting diamond EL element in accordance with the present invention will be explained.

Figures 3A, 3B:
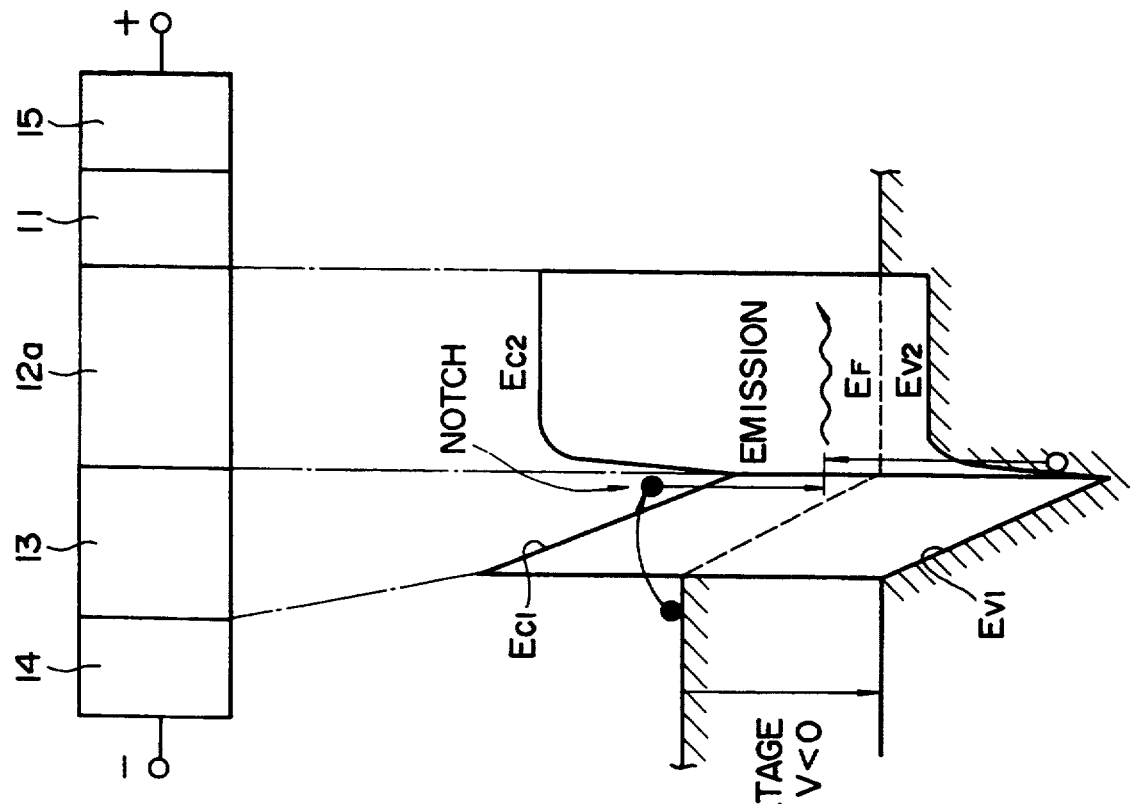
FIG. 3(a) and 3(b) are diagrams for explaining the light emitting mechanism of a semiconducting diamond EL element, in accordance with the present invention, employing a p-type semiconductor diamond layer.

Referring to FIG. 3(a), a semiconducting diamond EL element comprises an electrically conductive substrate 11, a p-type semiconducting diamond layer 12a formed on the front surface of the substrate 11, an insulating diamond layer 13 formed on the p-type semiconducting diamond layer 12a, a front electrode 14 on the insulating diamond layer 13, and a back electrode 15 formed on the backside of the substrate 11. FIG. 3(b) is an energy level diagram showing energy levels in the semiconducting diamond EL element when it is forward biased, in which $E_{c1}$ and $E_{c2}$ are the energies at the lower ends of the conduction bands, $E_{v1}$ and $E_{v2}$ are the energies at the upper end of the valence bands, and $E_F$ is the Fermi level. The open circles represent holes, and solid circles represent electrons. Assume that a voltage V is applied across the electrodes 14 and 15 with the front electrode 14 connected to the cathode of the power supply; namely, the semiconducting diamond EL element is forward biased so that a positive voltage is applied to the p-type semiconducting diamond layer 12a with respect to the front electrode 14. In this case, the energy band of the insulating diamond layer 13 is bent so that the energy $E_{c1}$ and $E_{v1}$ decreases toward the interface between the insulating diamond layer 13 and the p-type semiconducting diamond layer 12a. Consequently, $E_{c2}$ at the surface of the p-type semiconducting diamond layer 12a is bent downward as shown in FIG. 3(b) to form a notch. Therefore, electrons are transported by quantum effect from the front electrode 14 to the notch and thus the electrons are accumulated at the notch. The accumulated electrons recombine with holes at the defect levels in the p-type semiconducting diamond layer 12a to emit light.

Figures 4A, 4B:
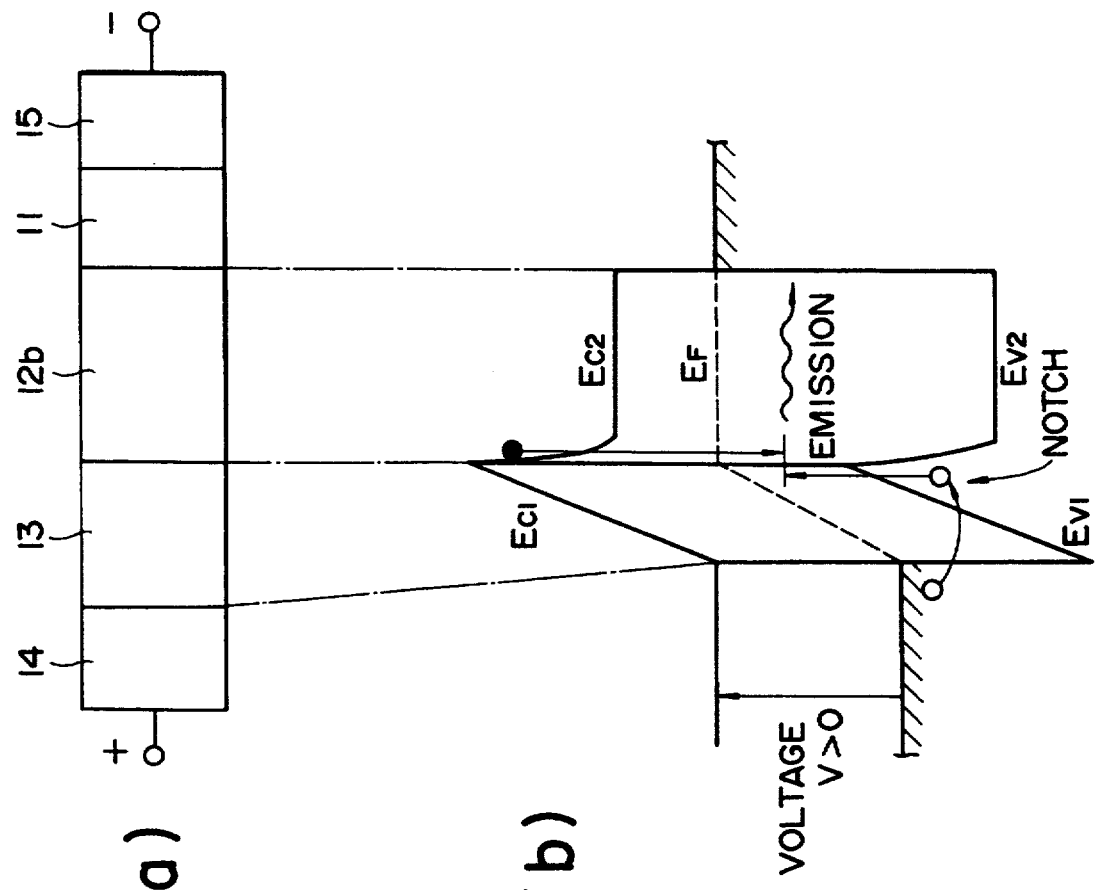
FIG. 4(a) and 4(b) are diagrams for explaining the light emitting mechanism of a semiconductor diamond EL element, in accordance with the present invention, employing an n-type semiconducting diamond layer.
Figure 5:
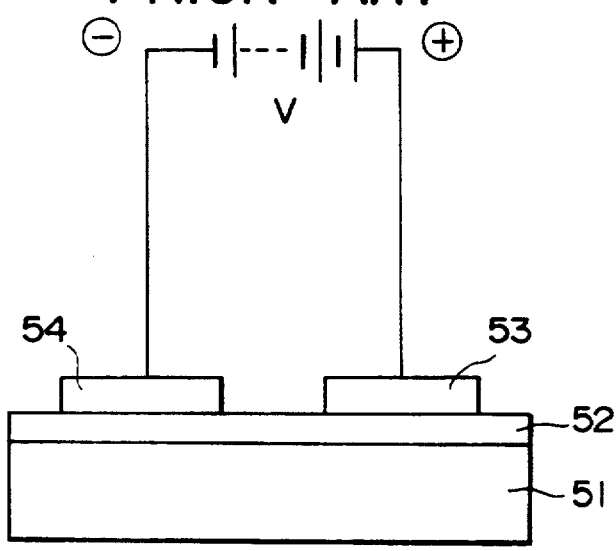
FIG. 5 is a diagrammatic view explaining the structure of a conventional semiconducting diamond EL element.
Figure 6:
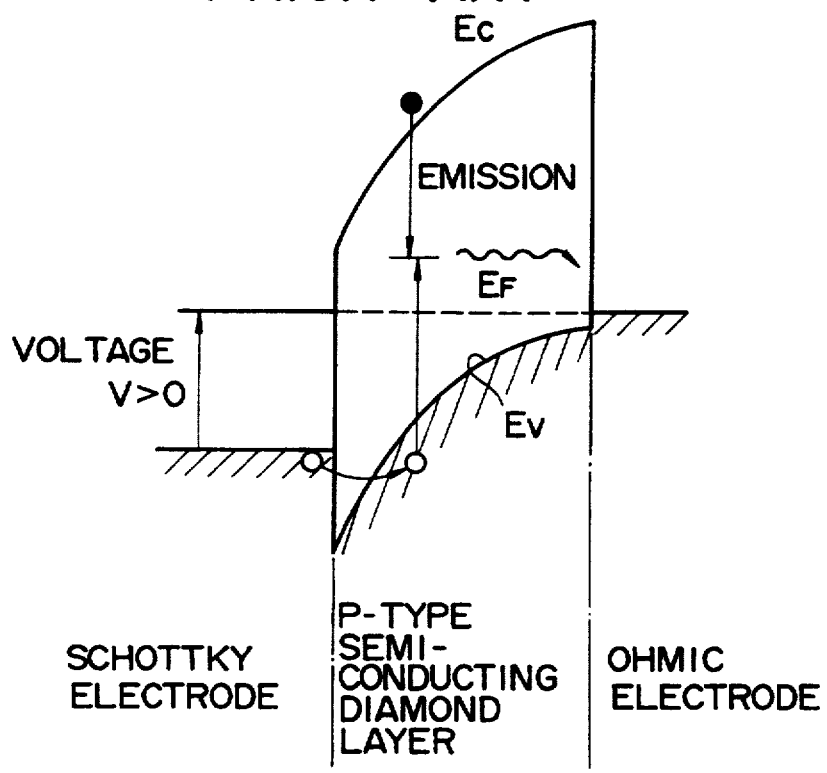
FIG. 6 is a diagram explaining the light emitting mechanism of the semiconductor diamond EL element of FIG. 5.

A semiconducting diamond EL element in accordance with the present invention shown in FIG. 4(a) is of the same construction as that shown in FIG. 3(a), except that the semiconducting diamond EL element shown in FIG. 4(a) employs an n-type semiconducting diamond layer 12b. FIG. 4(b) is an energy band diagram for the semiconducting diamond EL element of FIG. 4(a) when it is forward biased, in which $E_{c1}$ and $E_{c2}$ are the energies at the lower ends of the conduction bands, $E_{v1}$ and $E_{v2}$ are the energies at the upper ends of the valence bands, open circles represent holes, and solid circles represent electrons.

Referring to FIG. 4(b), when a voltage V is applied across the electrodes 14 and 15 with the front electrode 14 connected to the positive electrode of the power supply, namely, when the semiconducting diamond EL element is forward biased, the energy band of the insulating diamond layer 13 is bent so that $E_{c1}$ and $E_{v1}$ increases toward the interface between the insulating diamond layer 13 and the n-type semiconducting diamond layer 12b. Consequently, $E_{v2}$ at the surface of the n-type semiconducting diamond layer 12b is bent upward as shown in FIG. 4(b) to form a notch in the energy band. Thus, holes are transported from the front electrode 14 to the notch and accumulated at the notch by quantum effect. The holes recombine with electrons at the defect levels in the n-type semiconducting diamond layer 12b to emit light.

Preferred embodiments of the present invention will be described hereinafter.

As shown in FIG. 1, a semiconducting diamond EL element according to a first embodiment according to the present invention comprises a Si substrate (silicon wafer) 1 having a low resistance, a p-type semiconducting layer 2a of a predetermined thickness of 10 μm formed on the Si substrate 1 by vapor phase synthesis, an insulating diamond layer 3 of a predetermined thickness of 0.5 μm formed on the semiconducting diamond layer 2a, a laminated Ti—Au front electrode 4 formed on the insulating diamond layer 3, and an Au back electrode 5 formed on the Si substrate 1 in an exposed portion of the front surface of the Si substrate 1.

The semiconducting diamond layer 2a is formed by microwave plasma chemical vapor deposition (CVD) process using a reaction gas of 0.3 volume % methane, 0.00005 volume % diborane ($B_2H_6$) and hydrogen as the balance.

The insulating diamond layer 3 is formed by microwave plasma CVD using a reaction gas of 0.3 volume % methane, and 99.7 volume % hydrogen.

The laminated Ti—Au front electrode 4 is formed by sequentially depositing a Ti film and an Au film by sputtering, and the back electrode 5 is formed in contact with the Si substrate 1.

When a voltage on the order of 350 V is applied across the electrodes 4 and 5 of the semiconducting diamond EL element thus fabricated as described above with the front electrode 4 connected to the positive terminal of a power supply, the semiconducting diamond EL element emitted greenish light. The luminous intensity of the semiconducting diamond EL element is increased by raising the voltage applied across the electrodes 4 and 5 without entailing dielectric breakdown. The relationship between the applied voltage and the EL intensity can be determined by changing the thickness of the insulating diamond layer 3.

FIG. 2 shows a semiconducting diamond EL element according to a second embodiment according to the present invention, in which the same reference numbers as in FIG. 1 designate corresponding parts.

As shown in FIG. 2, the semiconducting diamond EL element comprises a Si substrate 1 having a low resistance, an n-type semiconducting diamond layer 2b formed on the Si substrate 1 having a thickness of 10 μm, an insulating diamond layer 3 formed on the n-type semiconducting diamond layer 2b, a laminated Ti—Au front electrode 4 formed on the insulating diamond layer 3, and a back electrode 5 formed on the backside of the Si substrate 1 in ohmic contact with the same.

The n-type semiconducting diamond layer 2b is formed by vapor phase synthesis by microwave plasma CVD using a reaction gas of 0.3 volume % methane, 0.005 volume % silane ($SiH_4$) and hydrogen as the balance. The insulating diamond layer 3 is formed by microwave plasma CVD using a reaction gas of 0.3 volume % methane and 99.7 volume % hydrogen. In forming the front electrode 4, a Ti film and an Au film are deposited in that order by sputtering. The back electrode 5 is formed by depositing an Au film.

When a voltage on the order of 400 V is applied across the electrodes 4 and 5 of the semiconducting diamond EL element with the front electrode 4 connected to the anode of a power supply, the semiconducting diamond EL element emitted bluish light. The luminous intensity is increased by raising the voltage applied across the electrodes 4 and 5.

Although the semiconducting diamond luminous element in this embodiment employs the front electrode 4, wherein the front electrode 4 is formed on the insulating diamond layer 3, formed of a Ti film having satisfactory adhesive affinity for the insulating diamond layer 3, and an Au film for preventing the oxidation of the Ti film, the front electrode 4 need not necessarily be limited thereto, but may be formed of, for example, Al having a small work function. The front electrode 4 and the back electrode 5 need not necessarily be formed of metals, but may be formed of conductive nonmetallic materials, such as polycrystalline silicon.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A semiconducting diamond electroluminescence element comprising:

an electrically conductive substrate;

a p-type semiconducting diamond electroluminescence layer formed on a surface of the conductive substrate, said semiconducting diamond layer having holes at defect levels;

an insulating diamond layer formed on the semiconducting diamond layer;

a first electrode formed on said insulating diamond layer and a second electrode formed on said conductive substrate, whereby when a negative voltage is applied to said first electrode, electrons are transported by quantum effect from said electrode to combine with said holes in said semiconducting diamond layer to thereby emit light, whereby a color of said light is primarily a function of a doping concentration of said semiconducting diamond electroluminescence layer and said color is independent of contact characteristics of said first and second electrodes.

2. A semiconducting diamond electroluminescence element according to claim 1, wherein the second electrode is formed on a same surface of the substrate as the semiconducting diamond layer.

3. A semiconducting diamond electroluminescence element according to claim 1, wherein the second electrode is formed on a surface of the substrate different from the surface that the semiconducting diamond layer is formed on.

4. A semiconducting diamond electroluminescence element comprising:

an electrically conductive substrate;

a n-type semiconducting diamond electroluminescence layer formed on a surface of the conductive substrate, said semiconducting diamond layer having electrons at defect levels;

an insulating diamond layer formed on the semiconducting diamond layer;

a first electrode formed on said insulating diamond layer and a second electrode formed on said conductive substrate, whereby when a positive voltage is applied to said first electrode, holes are transported by quantum effect from said electrode to combine with said electrons in said semiconducting diamond layer to thereby emit light, whereby a color of said light is primarily a function of a doping concentration of said semiconducting diamond electroluminescence layer and said color is independent of contact characteristic of said first and second electrodes.

5. A semiconducting diamond electroluminescence element according to claim 4, wherein the second electrode is formed on a same surface of the substrate as the semiconducting diamond layer.

6. A semiconducting diamond electroluminescence element according to claim 4, wherein the second electrode is formed on a surface of the substrate different from the surface that the semiconducting diamond layer is formed on.

* * * * *